United States Patent
Lim

(10) Patent No.: US 10,613,566 B2
(45) Date of Patent: Apr. 7, 2020

(54) REAL-TIME SLOPE CONTROL APPARATUS FOR VOLTAGE REGULATOR AND OPERATING METHOD THEREOF

(71) Applicant: HYUNDAI AUTRON CO., LTD., Seoul (KR)

(72) Inventor: Ji Hoon Lim, Gwangju-si (KR)

(73) Assignee: Hyundai Autron Co., Ltd., Seoul (KR)

(*) Notice: Subject to any disclaimer, the term of this patent is extended or adjusted under 35 U.S.C. 154(b) by 0 days.

(21) Appl. No.: 16/152,642

(22) Filed: Oct. 5, 2018

(65) Prior Publication Data

US 2019/0107856 A1 Apr. 11, 2019

(30) Foreign Application Priority Data

Oct. 11, 2017 (KR) .................. 10-2017-0129621

(51) Int. Cl.
*G05F 1/565* (2006.01)
*G05F 1/575* (2006.01)
(Continued)

(52) U.S. Cl.
CPC .............. *G05F 1/59* (2013.01); *G05F 1/575* (2013.01); *G05F 1/461* (2013.01); *G05F 1/462* (2013.01);
(Continued)

(58) Field of Classification Search
CPC ... G05F 1/10; G05F 1/46; G05F 1/461; G05F 1/462; G05F 1/56; G05F 1/575;
(Continued)

(56) References Cited

U.S. PATENT DOCUMENTS 7,728,569 B1 * 6/2010 Le .................... G05F 1/575
 323/280
8,179,193 B1 * 5/2012 Wright .................. G06F 1/24
 327/538
(Continued)

FOREIGN PATENT DOCUMENTS

KR 10-0819851 B1 4/2008
KR 10-1291344 B1 7/2013

OTHER PUBLICATIONS

Office Action, Chinese Intellectual Property Office, dated Nov. 29, 2019, China.

*Primary Examiner* — Nguyen Tran
*Assistant Examiner* — David A. Singh
(74) *Attorney, Agent, or Firm* — Baker & Hostetler LLP; Hyunho Park

(57) ABSTRACT

A real-time slope control apparatus includes power-train transistors coupled between a power terminal and an output node and turned on in response to an error signal, a voltage regulator, a comparator configured to compare whether the feedback voltage and a sub-reference voltage match each other, pull-up transistors coupled between the power terminal and the output node and sequentially turned on in response to first control signals corresponding to a comparison result value of the comparator, and pull-down transistors coupled between the output node and the ground terminal and sequentially turned on in response to second control signals corresponding to the comparison result value of the comparator.

14 Claims, 3 Drawing Sheets

(51) Int. Cl.
  *G05F 1/618* (2006.01)
  *H02M 3/156* (2006.01)
  *G05F 1/59* (2006.01)
  *H03K 17/687* (2006.01)
  *G05F 1/46* (2006.01)
  *H03K 17/56* (2006.01)

(52) U.S. Cl.
  CPC .............. *G05F 1/565* (2013.01); *G05F 1/618* (2013.01); *H02M 2003/1566* (2013.01); *H03K 17/56* (2013.01); *H03K 17/6871* (2013.01)

(58) Field of Classification Search
  CPC ............ G05F 1/59; G05F 1/613; G05F 1/618; H03K 17/00; H03K 17/01; H03K 17/12; H03K 17/51; H03K 17/56; H03K 17/687; H03K 17/6871; H03K 17/6874; H03K 17/6877; H02M 2003/1566
  USPC .......... 323/273–281; 327/108–112, 538–543
  See application file for complete search history.

(56) References Cited

U.S. PATENT DOCUMENTS

| | | | | |
|---|---|---|---|---|
| 8,710,812 | B1* | 4/2014 | Edwards | G05F 3/30 323/281 |
| 9,552,006 | B1* | 1/2017 | Gorecki | G05F 1/565 |
| 9,753,476 | B1* | 9/2017 | Shukla | G05F 1/562 |
| 2002/0027455 | A1* | 3/2002 | Chrappan Soldavini | H03K 17/063 327/108 |
| 2006/0255842 | A1* | 11/2006 | Hayashi | H03K 19/0005 327/108 |
| 2007/0296389 | A1* | 12/2007 | Chen | H02M 3/158 323/290 |
| 2008/0297234 | A1* | 12/2008 | Moholt | G05F 3/262 327/541 |
| 2009/0033298 | A1* | 2/2009 | Kleveland | G05F 1/575 323/271 |
| 2009/0295353 | A1* | 12/2009 | De Lima Filho | H02M 3/158 323/284 |
| 2009/0322295 | A1* | 12/2009 | Scoones | G05F 1/56 323/282 |
| 2010/0164550 | A1* | 7/2010 | Son | H03K 3/02337 327/88 |
| 2011/0181259 | A1* | 7/2011 | Shen | G05F 1/575 323/282 |
| 2012/0105047 | A1* | 5/2012 | Huang | G05F 1/56 323/351 |
| 2012/0283983 | A1* | 11/2012 | Cheng | G01K 7/01 702/130 |
| 2012/0286135 | A1* | 11/2012 | Gong | G05F 1/56 250/200 |
| 2014/0063668 | A1* | 3/2014 | Nagata | G05F 1/56 361/57 |
| 2014/0097816 | A1* | 4/2014 | Chen | G05F 1/468 323/283 |
| 2014/0176108 | A1* | 6/2014 | Heo | H02J 3/385 323/299 |
| 2014/0266098 | A1* | 9/2014 | Dao | G05F 1/573 323/273 |
| 2014/0266121 | A1* | 9/2014 | Wee | H02M 3/1588 323/283 |
| 2015/0108953 | A1* | 4/2015 | Kobayashi | G05F 1/56 323/268 |
| 2015/0137780 | A1* | 5/2015 | Lerner | G05F 1/56 323/280 |
| 2015/0177752 | A1* | 6/2015 | Nakashimo | G05F 1/10 323/265 |
| 2015/0177754 | A1* | 6/2015 | Mengad | G05F 1/56 323/280 |
| 2016/0077537 | A1* | 3/2016 | Enjalbert | G05F 1/575 323/280 |
| 2017/0236468 | A1 | 8/2017 | Wang et al. | |
| 2018/0026531 | A1* | 1/2018 | Nagda | H02M 1/08 327/109 |
| 2018/0088615 | A1* | 3/2018 | Mori | H02M 1/00 |
| 2018/0150093 | A1* | 5/2018 | Poletto | G05F 1/575 |
| 2019/0086943 | A1* | 3/2019 | Namekawa | G05F 1/575 |

* cited by examiner

REAL-TIME SLOPE CONTROL APPARATUS FOR VOLTAGE REGULATOR AND OPERATING METHOD THEREOF

CROSS-REFERENCE TO RELATED APPLICATIONS

This US non-provisional patent application claims priority under 35 USC § 119 to Korean Patent Application No. 10-2017-0129621, filed on Oct. 11, 2017, the entirety of which is hereby incorporated by reference.

TECHNICAL FIELD

Embodiments of the present disclosure relate to a real-time slope control apparatus for a voltage regulator and an operating method thereof.

BACKGROUND

A voltage regulator is used in various electrical and electromechanical applications. For example, a typical DC voltage regulator is implemented in conjunction with a static circuit configured to receive a variable DC voltage input and generate a rectified DC voltage output. An output voltage is maintained for changes in input voltage and output load current. A type of voltage regulator widely used in industrial and commercial applications is a low dropout regulator (LDO). The LDO is known as functioning using a low voltage applied before rectification is stopped.

SUMMARY

The present disclosure provides a real-time slope control apparatus for a voltage regulator having improved electromagnetic interference (EMI) characteristics and an operating method of the real-time slope control apparatus.

Example embodiments of the present disclosure provide a real-time slope control apparatus. The real-time slope control apparatus includes power-train transistors coupled between a power terminal and an output node and turned on in response to an error signal, a voltage regulator configured to output an output voltage to the output node, to generate a feedback voltage at a feedback node between the output node and a ground terminal, and to compare the feedback voltage with a reference voltage to output the error signal, a comparator configured to compare whether the feedback voltage and a sub-reference voltage match each other, the sub-reference voltage being generated by dividing the reference voltage, pull-up transistors coupled between the power terminal and the output node and sequentially turned on in response to first control signals corresponding to a comparison result value of the comparator, and pull-down transistors coupled between the output node and the ground terminal and sequentially turned on in response to second control signals corresponding to the comparison result value of the comparator.

In example embodiments, the voltage regulator may include a first resistor coupled between the output node and the feedback node; a second resistor coupled between the feedback node and the ground terminal; and an error amplifier configured to compare the reference voltage with the feedback voltage to output the error signal.

In example embodiments, the real-time slope control apparatus may further include a reference voltage generator configured to generate the reference voltage.

In example embodiments, the real-time slope control apparatus may further include a multiplexer configured to divide the reference voltage generate to a plurality of sub-reference voltages and to select one of the plurality of sub-reference voltages as a sub-reference voltage in response to a selection signal.

In example embodiments, the real-time slope control apparatus may further include a first shift register configured to generate and store the first control signals in response to the comparison result value of the comparator; and a second shift register configured to generate and store the second control signals in response to the comparison result value of the comparator.

In example embodiments, the first control signals may be generated when the comparison result value indicates that rising time of a voltage slope is fast, and the second control signals may be generated when the comparison result value indicates that the rising time of the voltage slope is slow.

In example embodiments, the real-time slope control apparatus may further include a sample and hold circuit configured to sample and hold the feedback voltage in response to a clock signal. The comparator may compare a feedback voltage of the sample and hold circuit with a sub-reference voltage of the multiplexer.

In example embodiments, timing of the selection signal and timing of the clock signal may match each other.

In example embodiments, the comparison result value of the comparator may be output when the feedback voltage and the sub-reference voltage match each other.

In example embodiments, the comparator may include a clock-based latch.

Example embodiments of the present disclosure provide a method of controlling a voltage slope of a voltage regulator in real time. The method includes determining whether a voltage slope of an output voltage output at an output node of the voltage regulator rises or falls, determining whether rising or falling of the voltage slope fails, considering power-up time, and sequentially turning on pull-up transistors coupled between a power terminal and the output node or sequentially turning on pull-down transistors coupled between the output node and a ground terminal when the rising or falling of the voltage slope fails.

In example embodiments, the method may further include generating a reference voltage and dividing the reference voltage to generate sub-reference voltages.

In example embodiments, the determining whether rising or falling of the voltage slope fails, considering power-up time may include selecting one of the sub-reference voltages and comparing a feedback voltage corresponding to the reference voltage with the selected sub-reference voltage.

In example embodiments, the pull-up transistors or the pull-down transistors may be turned on according to the comparison result value to compensate for the voltage slope.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
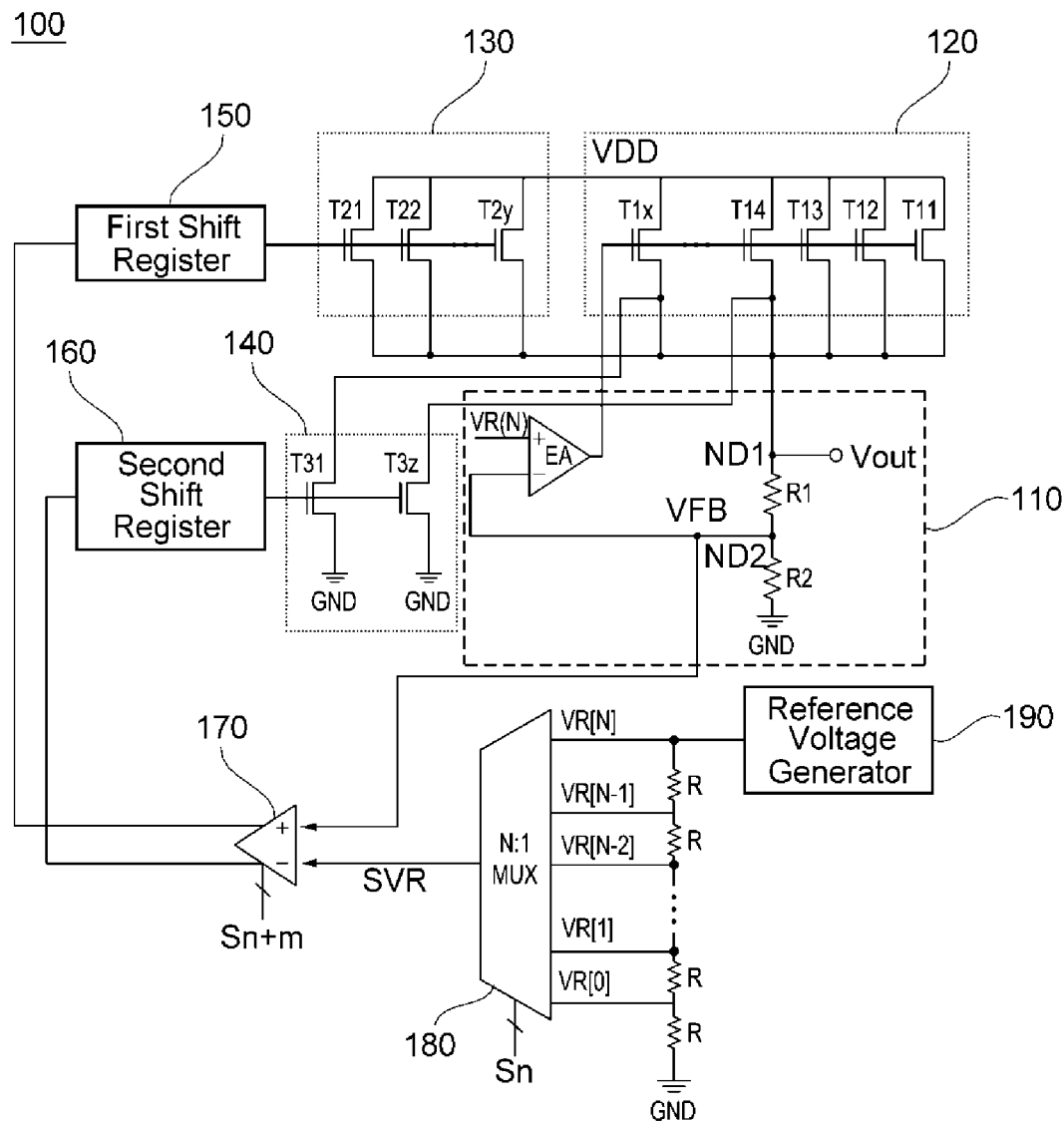
FIG. 1 illustrates a real-time slope control apparatus for a voltage regulator according to an example embodiment of the present disclosure.

The advantages and features of the present disclosure and methods of achieving them will be apparent from the following exemplary embodiments that will be described in more detail with reference to the accompanying drawings. It should be noted, however, that the present disclosure is not limited to the following exemplary embodiments, and may be implemented in various forms. Accordingly, the exemplary embodiments are provided only to disclose the present disclosure and let those skilled in the art know the category of the present disclosure.

In the specification, it will be understood that when an element is referred to as being "on" another layer or substrate, it can be directly on the other element, or intervening elements may also be present. In the drawings, thicknesses of elements are exaggerated for clarity of illustration.

Exemplary embodiments of the invention will be described below with reference to cross-sectional views, which are exemplary drawings of the invention. The exemplary drawings may be modified by manufacturing techniques and/or tolerances. Accordingly, the exemplary embodiments of the invention are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit the invention. Though terms like a first, a second, and a third are used to describe various elements in various embodiments of the present disclosure, the elements are not limited to these terms. These terms are used only to tell one element from another element. An embodiment described and exemplified herein includes a complementary embodiment thereof.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

The present disclosure will now be described more fully hereinafter with reference to accompanying drawing, in which example embodiments of the present disclosure are shown.

A voltage regulator according to an example embodiment of the present disclosure may measure and compensate for a voltage slope in real time while the voltage slope rises and falls.

FIG. 1 illustrates a real-time slope control apparatus 100 for a voltage regulator according to an example embodiment of the present disclosure. Referring to FIG. 1, the real-time slope control apparatus 100 may include a voltage regulator 110, power train transistors T11 to T1$x$ (x being a positive integer greater than or equal to 2), pull-up transistors T21 to T2$y$ (y being a positive integer greater than or equal to 2), pull-down transistors T31 to T3$z$ (z being a positive integer greater than or equal to 2), a first shift register 150, a second shift register 160, a comparator 170, a multiplexer 180, and a reference voltage generator 190.

The voltage regulator 100 may be implemented to output a predetermined output voltage Vout to an output node ND1. In example embodiments, the voltage regulator 110 may include a low dropout regulator (LDO).

The voltage regulator 110 may include a first resistor R1 coupled between the output node ND1 and a feedback node ND2, a second resistor R2 coupled between the feedback node ND2 and a ground terminal GND, and an error amplifier EA. The error amplifier EA may compare a reference voltage VR[N] (N being a positive integer greater than or equal to 2) and a feedback voltage VFB with each other and may output an error signal. The feedback voltage VFB is a voltage at the feedback node ND2.

The power train transistors 120 (T11 to T1$x$ (x being a positive integer greater than or equal to 2)) may be coupled in parallel between a power terminal VDD and an output node ND1. In example embodiments, the power train transistors T11 to T1$x$ may be turned on in response to an error signal output from the error amplifier EA. For example, when the feedback voltage VFB is smaller than the reference voltage VR[N], the power train transistors T11 to T1$x$ may be turned on in response to the error signal.

The pull-up transistors 130 (T21 to T2$y$ (y being a positive integer greater than or equal to 2)) may be used for slope suddenly control. The pull-up transistors T21 to T2$y$ may be coupled in parallel between the power terminal VDD and the output node ND1. In example embodiments, the pull-up transistors T21 to T2$y$ may be turned on or turned off in response to pull-up control signals. In some embodiments, the respective pull-up transistors T21 to T2$y$ may be implemented with the same size (width-to-length (W/L) ratio). In other embodiments, the respective pull-up transistors T21 to T2$y$ may be implemented with different sizes.

In example embodiments, each of the pull-up transistors T21 to T2$y$ may include a metal-oxide-semiconductor (MOS) transistor.

The pull-down transistors 140 (T31 to T3$z$ (z being a positive integer greater than or equal to 2)) may be used for slope gradually control. The pull-down transistors T31 to T3$z$ may be coupled in parallel between the output node ND1 and the ground terminal GND. In example embodiments, the pull-down transistors T31 to T3$z$ may be turned on or turned off in response to pull-down control signals. In some embodiments, the respective pull-down transistors T31 to T3$z$ may be implemented with the same size (width-to-length (W/L) ratio). In other embodiments, the respective pull-down transistors T31 to T3$z$ may be implemented with different sizes.

In example embodiments, each of the pull-down transistors T31 to T3$z$ may be a metal-oxide-semiconductor (MOS) transistor.

The first shift register 150 may be implemented to generate pull-up control signals. In example embodiments, the first shift register 150 may include an N-bit shift register.

The second shift register 160 may be implemented to generate pull-down control signals. In example embodiments, the second shift register 150 may include an N-bit shift register.

The comparator 170 may compare the feedback voltage VFB and a sub-reference voltage SVR with each other in response to a control signal Sn+m and may output a comparison result value to the first shift register 150 or the second shift register 160. The comparator 170 may compare the feedback voltage VFB and the sub-reference voltage SVR with each other to determine whether a rising or falling voltage slope fails.

The multiplexer 180 may be implemented to output of sub-reference voltages VR[0] to VR[N−1] in response to a selection signal. The sub-reference signals VR[0] to VR[N−1] may be generated by dividing the reference voltage VR[N] using a resistor R. That is, the multiplexer 180 may include a resistor divider.

The reference voltage generator 190 may be implemented to generate the reference voltage VR[N].

In general, a low dropout regulator (LDO) should follow power-up time during power-up. In a case in which an LDO does not follow the power-up time, a functional safety application may determine the case to be unsafe because the case is not a leakage current and a normal operation of a corresponding circuit. Accordingly, the functional safety application should use a measurement only for the power-up time to check whether a failure occurs. When the failure occurs, an auto failure-restore function is significantly important.

Power-up time is determined by a developer or a client. Accordingly, a start point to an end point of power-up are known. Since the start point and the end point of power-up are known, a voltage level corresponding to time of corresponding timing increase may also be known.

The comparator 170 may be implemented to output a comparison result value in the form of a clock-based latch. That is, the comparison result value may be output only when the feedback voltage VFB and the sub-reference voltage SVR match each other.

When rising time of a voltage slope is determined to be fast according to the comparison result value, a "slope gradually control" block, that is, the pull-down transistors 140 may be sequentially turned on. Accordingly, a current for voltage slope rising may be decreased.

Meanwhile, when rising time of a voltage slope is determined to be slow according to the comparison result value, a "slope suddenly control" block, that is, the pull-up transistors 130 may be sequentially turned on. Accordingly, a current for voltage slope rising may be increased. As described above, entire voltage slope timing may be compensated.

A result value of the comparator 170 may be stored in the shift registers 150 and 160 to sequentially increase and decrease a current.

The real-time slope control apparatus 100 may monitor timing from a start point to an end point of a voltage slope, detect a timing failure, and monitor a proceeding state (increase/decrease) of the voltage slope in real time to automatically compensate for the voltage slope.

That is, the real-time slope control apparatus 100 may perform real-time monitoring in a proceeding stage of the voltage slope. In example embodiments, the real-time slope control apparatus 100 may provide an auto restore function according to a real-time monitoring result when a slope timing failure occurs.

Figure 2:
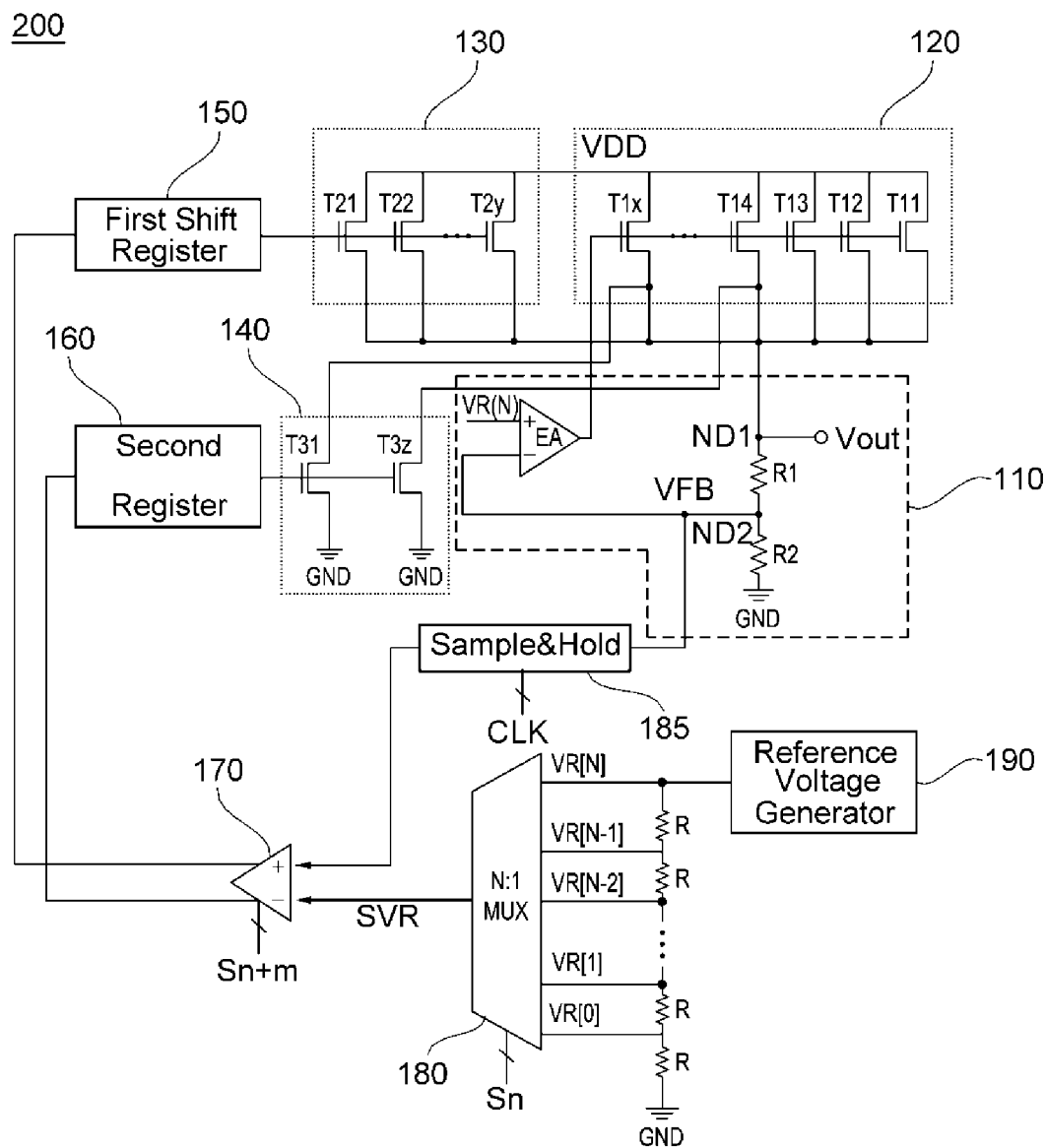
FIG. 2 illustrates a real-time slope control apparatus for a voltage regulator according to another example embodiment of the present disclosure.

A real-time slope control apparatus according to example embodiments of the present disclosure may further include a sample and hold circuit configured to sample and hold a feedback voltage VFB. FIG. 2 illustrates a real-time slope control apparatus 200 for a voltage regulator according to another example embodiment of the present disclosure. Referring to FIG. 2, compared with the real-time slope control apparatus 100 illustrated in FIG. 1, the real-time slope control apparatus 200 may further include a sample and hold circuit 185.

The sample and hold circuit 185 may be implemented to store an analog signal of a rising voltage slope as a sub-reference voltage SVR at a time point of applying a clock.

When the sample and hold circuit 185 is used, clock timing of the sample and hold circuit 185 should match selection signal (Sn) timing of a multiplexer 180 for outputting a fixed sub-reference voltage SVR to match a reference voltage. A period of a clock CLK and the selection signal (Sn) timing of the multiplexer 180 may match power-up time.

Electronic apparatuses, such as automobiles and airplanes, equipped with applications directly linked with life are significantly sensitive to electromagnetic interference (EMI) which may cause malfunction. Accordingly, many efforts have been made to attenuate EMI in circuits operating with a high current, similarly to automobile communication interfaces (I/F), such as a motor controller (for example, a high side, low side or H&L side driver), a power supply (for example, a switch mode power supply), a high capacitance on/off switch (for example, a power MOSFET), and a controller area network (CAN)/LIN. A representative technique for attenuating EMI controls a slope of a control voltage to prevent a current peak from occurring due to rapid change in the slope of the control voltage.

Not only electromagnetic compatibility (EMC) but also recent revision of Functional Safety—Part 11 has been issued. According to the revised Part 11, each voltage regulator is forced to designate turn-on/off time too fast for power-up time as a failure mode in the case of an H&L side driver or the like. Accordingly, there is an increasing interest in control of a slope.

A conventional slope control method is classified into two methods. One method is to use a filter considering parasitic through simulation and verification. Due to use of the filter, a slope is controlled to be always constant in spite of process, voltage, and temperature (PVT) variations. However, this method may encounter a failure that often occurs in a situation unconsidered during the verification. The other method is a simple failure detection method which includes measuring a time from a start point (10 percent based on ground) to an end point (90 percent based on the ground) by a counter or the like, determining that there is no problem when rising or falling is completed within the measured time, and providing information to a microcontroller unit (MCU) or the like when a failure occurs. Accordingly, studies have been conducted on methods of compensating for a slope by increasing or decreasing a current for controlling the slope according to a timing measurement result obtained by a counter. However, since the methods are not methods of monitoring a voltage slope in a stage in which the voltage slope increases or decreases, it is difficult to compensate for the voltage slope in real time.

A circuit operation of the present disclosure will now be described with respect to an LDO which is a type of linear regular among regulators.

According to the present disclosure, a slope of an output of a communication system such as an H/L side driver, a CAN/LIN or the like may be controlled in real time. In the case of regulators (SMPS, LDO, and the like), power-up/down time may be monitored and controlled in real time. In the monitoring operation, an output voltage of an application is monitored in an S&H side regulator in real time by fixed rising/falling time and a level of the output voltage is compared with an expected voltage level at this time to determine MOSFET on/off of a power train. For this reason, there is no similarity between the present disclosure and a corresponding patent.

Figure 3:
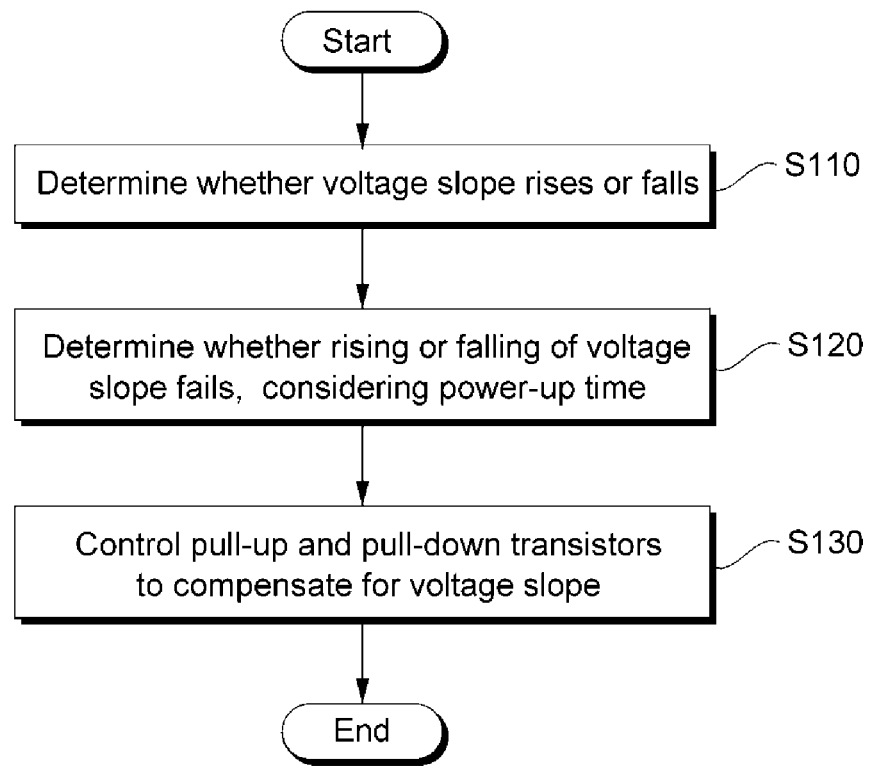
FIG. 3 is a flowchart illustrating an operating method of a real-time slope control apparatus according to an example embodiment of the present disclosure.

FIG. 3 is a flowchart illustrating an operating method of a real-time slope control apparatus according to an example embodiment of the present disclosure. Referring to FIGS. 1 to 3, a method of controlling a voltage slope of the real-time slope control apparatus 100 in real time will now be described below.

The comparator 170 may compare the feedback voltage VFB and the sub-reference voltage SVR with each other to determine whether a voltage slope rises or falls (S110). Considering known power-up time, a determination may be made as to whether rising or falling of the voltage slope fails (S120). When the rising of the voltage slope fails, the pull-down transistors 140 may be sequentially turned on to adjust the rising degree of the voltage slope. On the other hand, when the falling of the voltage slope fails, the pull-up transistors 130 may be sequentially turned on to adjust the falling degree of the voltage slope (S130).

As can be appreciated by a person of ordinary skill in the art, steps and/or operations according to present disclosure may occur in other orders, or in parallel, or concurrently in other embodiments for other epochs or the like.

Depending on example embodiments of the present disclosure, some or all of the steps and/or operations may be implemented or otherwise performed, at least in part, using one or more processors running instruction(s), program(s), interactive data structure(s), client and/or server components, where such instruction(s), program(s), interactive data structure(s), client and/or server components are stored in one or more non-transitory computer-readable media. The one or more non-transitory computer-readable media may be instantiated in software, firmware, hardware, and/or any combination thereof. Moreover, the functionality of any "module" discussed herein may be implemented in software, firmware, hardware, and/or any combination thereof.

The one or more non-transitory computer-readable media and/or means for implementing/performing one or more operations/steps/modules of embodiments of the present disclosure may include, without limitation, application-specific integrated circuits (ASICs), standard integrated circuits, controllers executing appropriate instructions, and including microcontrollers and/or embedded controllers, field-programmable gate arrays (FPGAs), complex programmable logic devices (CPLDs), and the like.

In example embodiments, a real-time slope control apparatus of the present disclosure may be applied to regulator, driver, and CAN/LIN communication output slopes.

As described above, a real-time slope control apparatus for a voltage regulator according to an example embodiment of the present disclosure may monitor timing from a star point to an end point of a voltage slope, detect a timing failure, and monitor a proceeding state (increase/decrease) of the voltage slope in real time to compensate for the voltage slope at the proceeding time point.

Although the present disclosure and its advantages have been described in detail, it should be understood that various changes, substitutions and alterations can be made herein without departing from the spirit and scope of the disclosure as defined by the following claims.

What is claimed is:

1. A real-time slope control apparatus comprising:
   power-train transistors coupled between a power terminal and an output node and turned on in response to an error signal;
   a voltage regulator configured to output an output voltage to the output node, to generate a feedback voltage at a feedback node between the output node and a ground terminal, and to compare the feedback voltage with a reference voltage to output the error signal;
   a comparator configured to compare whether the feedback voltage with a sub-reference voltage match each other, the sub-reference voltage being generated by dividing the reference voltage;
   pull-up transistors coupled between the power terminal and the output node and sequentially turned on in response to first control signals corresponding to a comparison result value of the comparator; and
   pull-down transistors coupled between the output node and the ground terminal and sequentially turned on in response to second control signals corresponding to the comparison result value of the comparator.

2. The real-time slope control apparatus of claim 1, wherein the voltage regulator comprises:
   a first resistor coupled between the output node and the feedback node;
   a second resistor coupled between the feedback node and the ground terminal; and
   an error amplifier configured to compare the reference voltage with the feedback voltage to output the error signal.

3. The real-time slope control apparatus of claim 2, further comprising:
   a reference voltage generator configured to generate the reference voltage.

4. The real-time slope control apparatus of claim 1, further comprising:
   a multiplexer configured to divide the reference voltage generate to a plurality of sub-reference voltages and to select one of the plurality of sub-reference voltages as a sub-reference voltage in response to a selection signal.

5. The real-time slope control apparatus of claim 4, further comprising:
   a first shift register configured to generate and store the first control signals in response to the comparison result value of the comparator; and a second shift register configured to generate and store the second control signals in response to the comparison result value of the comparator.

6. The real-time slope control apparatus of claim 5, wherein the first control signals are generated when the comparison result value indicates that rising time of a voltage slope is fast, and the second control signals are generated when the comparison result value indicates that the rising time of the voltage slope is slow.

7. The real-time slope control apparatus of claim 4, further comprising:
   a sample and hold circuit configured to sample and hold the feedback voltage in response to a clock signal, wherein the comparator compares a feedback voltage of the sample and hold circuit with a sub-reference voltage of the multiplexer.

8. The real-time slope control apparatus of claim 7, wherein timing of the selection signal and timing of the clock signal match each other.

9. The real-time slope control apparatus of claim 4, wherein the comparison result value of the comparator is output when the feedback voltage and the sub-reference voltage match each other.

10. The real-time slope control apparatus of claim 4, wherein the comparator comprises a clock-based latch.

11. A method of controlling a voltage slope of a voltage regulator in real time, the method comprising:
   determining whether a voltage slope of an output voltage output at an output node of the voltage regulator rises or falls;
   determining whether rising or falling of the voltage slope fails, considering the output voltage between a start point and an end point of power-up time; and
   sequentially turning on pull-up transistors coupled between a power terminal and the output node or sequentially turning on pull-down transistors coupled between the output node and a ground terminal when the rising or falling of the voltage slope fails.

12. The method of claim 11, further comprising:
   generating a reference voltage; and dividing the reference voltage to generate sub-reference voltages.

13. The method of claim 12, wherein the determining whether rising or falling of the voltage slope fails, considering power-up time comprises:
   selecting one of the sub-reference voltages; and comparing a feedback voltage corresponding to the reference voltage with the selected sub-reference voltage and outputting a comparison result value.

14. The method of claim 13, wherein the pull-up transistors or the pull-down transistors are turned on according to the comparison result value to compensate for the voltage slope.

* * * * *